United States Patent
Imai et al.

(10) Patent No.: US 6,715,666 B2
(45) Date of Patent: Apr. 6, 2004

(54) WIRE BONDING METHOD, METHOD OF FORMING BUMP AND BUMP

(75) Inventors: Rei Imai, Hamura (JP); Tamanari Yasuda, Hamura (JP); Shinobu Ishii, Hamura (JP); Yuji Kosaku, Hamura (JP)

(73) Assignee: Kaijo Corporation (JP)

( * ) Notice: Subject to any disclaimer, the term of this patent is extended or adjusted under 35 U.S.C. 154(b) by 0 days.

(21) Appl. No.: 10/243,201

(22) Filed: Sep. 13, 2002

(65) Prior Publication Data

US 2004/0026480 A1 Feb. 12, 2004

(30) Foreign Application Priority Data

Aug. 8, 2002 (JP) .................................... 2002-231931

(51) Int. Cl.⁷ .......................... B23K 31/02; B23K 37/00
(52) U.S. Cl. ........................... 228/180.5; 228/180.22; 228/246; 228/4.5; 228/6.2; 219/85.18
(58) Field of Search ..................... 228/180.5, 180.22, 228/246, 4.5, 6.2; 219/85.18

(56) References Cited

U.S. PATENT DOCUMENTS

| 5,485,949 | A | * | 1/1996 | Tomura et al. | .......... | 228/180.5 |
| 5,842,628 | A | * | 12/1998 | Nomoto et al. | .......... | 228/180.5 |
| 6,079,610 | A | | 6/2000 | Maeda | | |
| 6,439,450 | B1 | * | 8/2002 | Chapman et al. | ......... | 228/180.5 |
| 6,467,677 | B1 | * | 10/2002 | Wildner | .................... | 228/180.5 |
| 6,527,163 | B1 | * | 3/2003 | Eslampour | ............... | 228/180.1 |
| 6,581,816 | B2 | * | 6/2003 | Vitali et al. | ............... | 228/180.5 |

FOREIGN PATENT DOCUMENTS

| JP | 63-304587 A1 | 12/1988 |
| JP | 3-183139 A1 | 8/1991 |
| JP | 10-112471 A1 | 4/1998 |

* cited by examiner

Primary Examiner—Tom Dunn
Assistant Examiner—Colleen P. Cooke
(74) Attorney, Agent, or Firm—Lerner, David, Littenberg, Krumholz & Mentlik, LLP

(57) ABSTRACT

A wire bonding method, a bump forming method and a bump which are capable of preventing contact of a wire with a substrate or a conductive lead after the wire is bonded to a bump, and which are capable of preventing generation of bending in the wire during bonding of the wire to the bump are disclosed. When a first conductor and a second conductor are wire bonded, a bump is previously formed on the second conductor by ball bonding. An inclined surface is formed on an upper end of the bump by moving a capillary along a predetermined path to operate the capillary. First bonding of a wire to the first conductor is carried out, then the wire is looped from the first conductor to the bump, and second bonding of the wire onto the inclined surface of the bump is carried out.

11 Claims, 8 Drawing Sheets

WIRE BONDING METHOD, METHOD OF FORMING BUMP AND BUMP

BACKGROUND OF THE INVENTION

1. Field of the Invention

The present invention relates to a method of wire bonding two conductors, a method of forming a bump and a bump, and more particularly to a method of wire bonding a first conductor and a second conductor by first bonding on the first conductor and second bonding on the second conductor, wherein a bump of a preferable shape is formed on the second conductor by ball bonding in advance, so that the wire-bonded wire does not come into contact with another wire or with a surface of a substrate, a method of forming such a bump and a bump.

2. Description of the Related Art

At the time of executing wire bonding, a method of wire bonding a semiconductor chip and a conductive lead or contact area, using a capillary with an Au wire inserted through the capillary, wherein a ball is formed at the tip end of the Au wire projected from the capillary by discharge from an electrode of an electric flame off, and first bonding with the capillary located on the semiconductor chip and second bonding with the capillary moved onto the contact area are carried out, is used commonly.

In this method, in the case where the contact area is made of a material having a poor bonding property with respect to the Au wire, such as Cu, Ni and flash Au plating, bonding cannot be executed directly on the contact area. For this reason, a base such as Au plating, an Au thick film or the like is previously formed on a part of the contact area onto which bonding is to be carried out.

However, it is not preferable to provide such a base in practice, and thus a method capable of directly bonding on the contact area even in the case where the contact area is made of a material having a poor bonding property with respect to the Au wire has been demanded.

For example, as shown in FIG. 10, Japanese Patent Application Laid-Open Publication No. 10-112471 discloses a method of wire bonding a first conductor 10 and a second conductor 20 by forming a bump 51a by ball bonding on the second conductor 20 of a substrate 30, wedge bonding the bump 51a at a position on a side thereof away from the first conductor 10, first bonding on the first conductor 10, and looping a wire 50 from the first conductor 10 to the bump 51a, followed by second bonding on the bump 51a.

According to this method, since wedge bonding is executed on the second conductor on the rearward side of the bump or on the side of the bump away from the first conductor after formation of the bump by ball bonding, a wedge bond has a bent shape so that generation of a bump tail can be eliminated.

In addition, it is disclosed that in second bonding on the bump, as shown in FIG. 11, when a capillary 40 is located such that a bent part 51b of the wire 50 extending from the bump 51a is placed in a bore 41 of the capillary 40, the bent part 51b is pressed by one side of an inner wall of the bore 41 so that the wire 50 and the bent part 51b are bonded together in the state where the wire 50 is deformed by the other side of the inner wall of the bore 41.

However, according to the method disclosed in this publication, as shown in FIG. 11, the wedge bond after the bump formation and the wire are bonded together, that is, curved surfaces are bonded to each other. Therefore, in the case where bonding is carried out while the curved surfaces are misaligned, consequently bending of the wire is generated, leading to a possibility of undesirable contact between adjacent wires.

Moreover, although generation of a bump tail can be restrained by forming the wedge bond after the bump formation to have a shape curved rearwards, a sufficient inclination and a flat surface cannot be ensured in bonding the wire to the bump, resulting in contact of the wire 50 with the substrate 30 or the contact area, as shown in the broken line in FIG. 11, which contact is generated after bonding of the bump 51a and the wire 50, being not prevented sufficiently.

SUMMARY OF THE INVENTION

The present invention has been made in view of the foregoing disadvantages of the prior art.

Therefore, an object of the present invention is to provide a wire bonding method, a bump forming method and a bump which are capable of preventing contact of a wire with a substrate or a conductive lead after bonding the wire to a bump, and which are capable of preventing generation of bending in the wire during bonding the wire to the bump.

In order to solve the above-mentioned problems, the following means are employed in the present invention.

According to a first aspect of the present invention, there is provided a method of wire bonding a first conductor and a second conductor. The method comprises the steps of: forming a bump on the second conductor by ball bonding on the second conductor; forming an inclined surface on an upper end of the bump; first bonding one end of a wire to the first conductor; and looping the wire from the first conductor to the bump on the second conductor, and then second bonding the other end of the wire to the inclined surface of the bump.

According to this aspect of the present invention, there is also provided a method of wire bonding a first conductor and a second conductor using a capillary having a bore formed therein and a wire extending through the bore. The method comprises the steps of: forming a bump on the second conductor by ball bonding on the second conductor while positioning the capillary above the second conductor; forming an inclined surface on an upper end of the bump by moving the capillary upwards, laterally moving the capillary to a side of the bump away from the first conductor, and moving the capillary downwards, followed by cutting the wire; first bonding one end of the wire to the first conductor; and second bonding the wire extending from the bore of the capillary and the inclination surface of the bump by means of a lower end portion of the capillary while positioning the capillary at the inclination surface of the bump, and cutting the wire at a portion thereof near the bonded portion.

In a preferred embodiment of the method of wire bonding according to the present invention, the inclined surface of the upper end of the bump is formed to be flat or concave; and the second bonding step includes pressing the wire onto the inclined surface of the bump by means of the lower end portion of the capillary while positioning the capillary at the inclination surface of the bump.

In a preferred embodiment of the method of wire bonding according to the present invention, the inclined surface of the bump is so formed that a line connecting opposite edges of the inclined surface has an inclination angle of 2° to 60° to a face of the second conductor, which angle is open toward the first conductor.

According to a second aspect of the present invention, there is provided a method of forming a bump on a second conductor in advance by ball bonding when a first conductor and the second conductor are wire bonded by carrying out first bonding on the first conductor and carrying out second bonding on the second conductor. The method comprises the steps of: lowering a capillary onto the second conductor and ball bonding a ball formed at a distal end of a wire to the second conductor, to thereby form a bump on the second conductor; then vertically raising the capillary; thereafter laterally moving the capillary in a direction away from the first conductor; subsequently lowering the capillary onto the bump to press a lower end portion of the capillary against the bump; and thereafter laterally moving the capillary in a direction toward the first conductor, whereby the bump is provided on an upper end thereof with an inclined surface.

According to this aspect of the present invention, there is also provided a method of forming a bump on a second conductor in advance by ball bonding when a first conductor and the second conductor are wire bonded by carrying out first bonding on the first conductor and carrying out second bonding on the second conductor. The method comprises the steps of: lowering a capillary onto the second conductor and ball bonding a ball formed at a distal end of a wire to the second conductor, to thereby form a bump on the second conductor; then vertically raising the capillary; thereafter laterally moving the capillary in a direction toward the first conductor; then vertically raising the capillary; thereafter laterally moving the capillary in a direction away from the first conductor; subsequently lowering the capillary onto the bump to press a lower portion of the capillary against the bump; and thereafter laterally moving the capillary in a direction toward the first conductor, whereby the bump is provided on an upper end thereof with an inclined surface.

In a preferred embodiment of the method of forming a bump according to the present invention, the inclined surface of the bump is so formed that a line connecting opposite edges of the inclined surface has an inclination angle of 2° to 60° to a face of the second conductor, which angle is open toward the first conductor.

According to a third aspect of the present invention, there is provided a bump which is formed on a second conductor in advance by ball bonding when a first conductor and the second conductor are wire bonded by carrying out first bonding on the first conductor and carrying out second bonding on the second conductor. The bump comprises an upper surface, which is formed to be flat or concave and which is so formed that a line connecting opposite edges of the upper surface has an inclination angle of 2° to 60° to a face of the second conductor, which angle is open toward the first conductor.

DETAILED DESCRIPTION OF THE INVENTION

Figure 1:
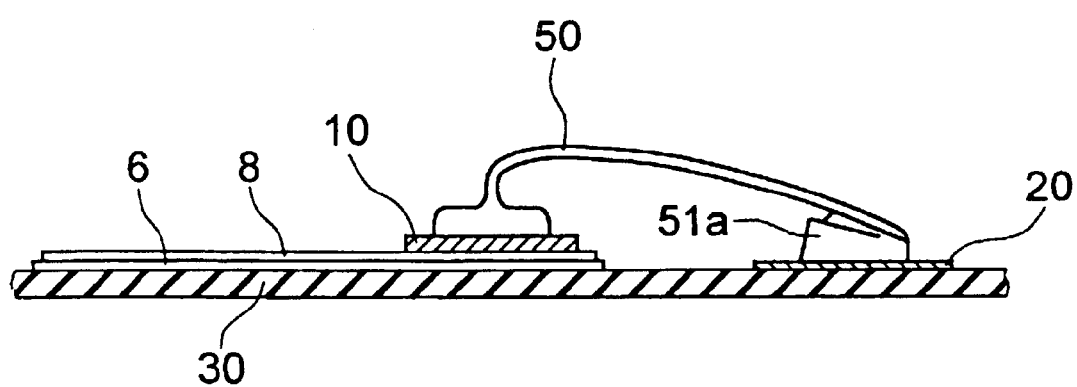
FIG. 1 is a cross-sectional view showing the wire-bonded state of a semiconductor chip and a contact area using a wire bonding method according to an embodiment of the present invention.

Hereinafter, the present invention will be explained specifically based on preferred embodiments shown in the accompanying drawings. In each of the several figures, the same reference numerals or characters denote equivalent or like parts.

Referring first to FIG. 1, the wire-bonded state between a semiconductor chip and a conductive lead or contact area using a wire bonding method according to an embodiment of the present invention is illustrated.

A semiconductor chip 8 is mounted on a substrate 30, such as a ceramic substrate, a printed substrate, a lead frame or the like, by die mounting paste 6. On the semiconductor chip 8, a bonding pad or first conductor 10 is formed. Also, on the substrate 30, a conductive lead or contact area 20, which is also referred to as a second conductor and made of a conductive material, such as Ni, Cu or the like, which exhibits a poor bonding property with an Au wire 50, is formed.

Now, a wire bonding method according to an embodiment of the present invention will be described with reference to FIGS. 2A to 2G.

Figure 2A:
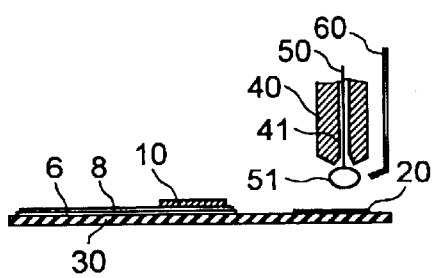
FIGS. 2A to 2G are diagrams illustrating the bonding steps in an embodiment of a wire bonding method of the present invention.

First, as shown in FIG. 2A, with the wire 50 inserted through a bore 41 of a capillary 40, a ball 51 is formed at a distal end of the wire 50 projecting from the capillary 40 by an electric flame off 60.

Figure 2E:
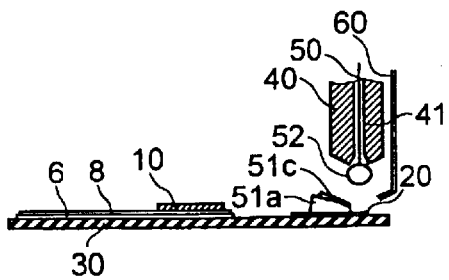
Figure 2B:
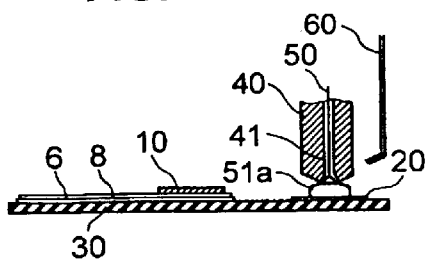

Next, as shown in FIG. 2B, the capillary 40 is lowered to the contact area 20 to ball bond the ball 51 formed on the tip end of the wire 50 onto the contact area 20, whereby a bump 51*a* is formed on the contact area 20.

Figure 2F:
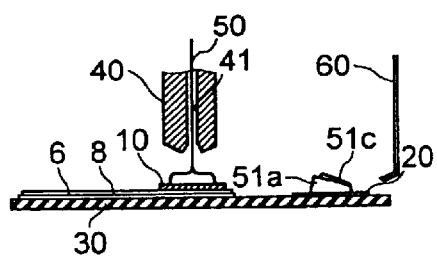
Figure 2C:
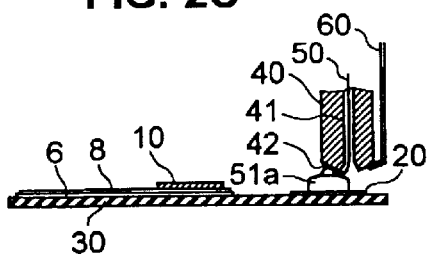

Then, as shown in FIG. 2C, after the capillary 40 is raise, the capillary 40 is laterally moved from the center of the bump 51*a* to the side of the bump 51*a* away from the bonding pad 10 which is the first conductor. Thereafter, as shown in FIG. 2D, the capillary 40 is lowered again so as to press a lower end portion 42 of the capillary 40 against a surface of the bump 51*a*, to thereby form an inclined surface 51*c* on an upper end of the bump 51*a*, and the wire 50 is cut.

Figure 3:
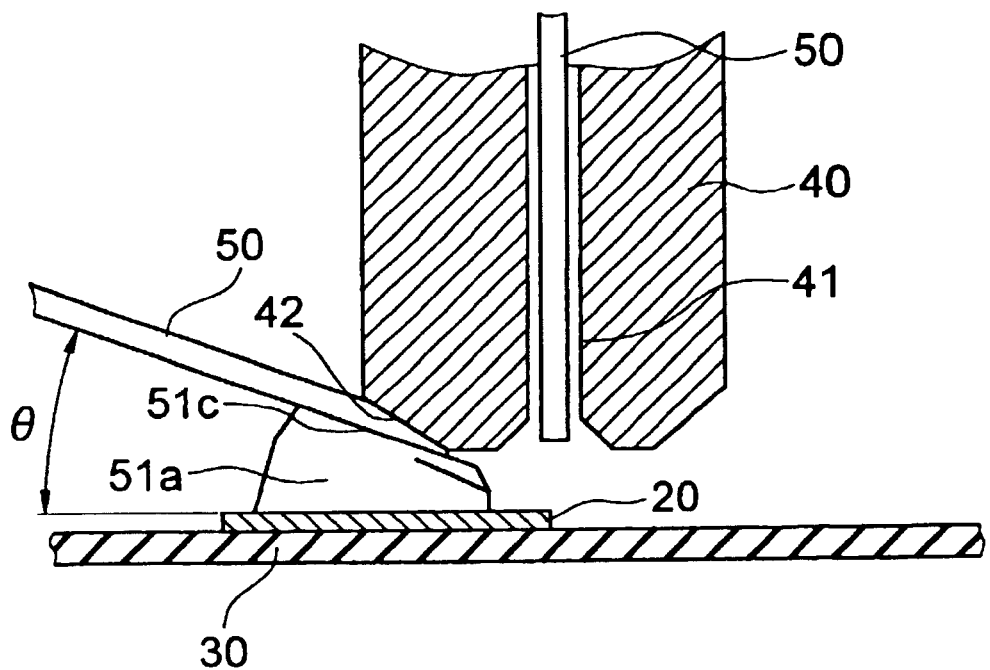
FIG. 3 is an enlarged cross-sectional view showing the situation at the time of second bonding a wire onto an inclined surface of an upper end of a bump.

It was found according to experiments that the bump 51*a*, as shown in FIG. 3, is so formed that the inclined surface 51*c* of the bump 51*a* has an inclination angle $\theta$ of 2° to 60° to a face of the contact area 20 which is the second conductor, which angle is open toward the boding pad 10, whereby the inclined surface 51*c* serves as a guide for the wire 50 from the bonding pad 10 to the inclined surface 51c of the bump 51a during wire bonding, resulting in generation of U-shaped sag in the wire 50 being prevented.

Then, as shown in FIG. 2E, another ball 52 is formed at the tip end of the wire 50 by the electric flame off 60. As shown in FIG. 2F, the capillary 40 is located at the bonding pad 10 of the semiconductor chip 8, and first bonding one end of the wire 50 to the bonding pad 10 is executed.

Figure 2G:
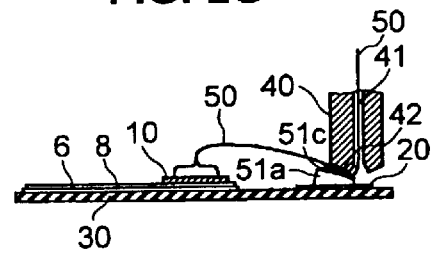
Figure 2D:
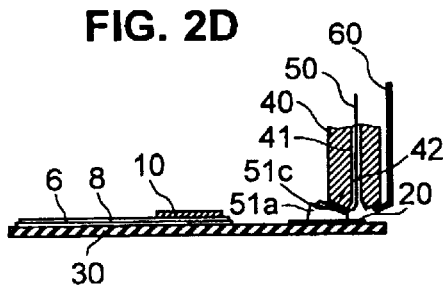

Next, as shown in FIG. 2G, the wire 50 is looped from the bonding pad 10 to above the inclined surface 51c of the bump 51a, and the other end of the wire 50 is second bonded to the inclined surface 51c of the bump 51a by the lower end portion 42 of the capillary 40, and the wire 50 is cut.

FIG. 3 is an enlarged diagram showing the situation at the time of bonding the wire 50 to the inclined surface 51c of the bump 51a in the above-mentioned step shown in FIG. 2G. As mentioned above, the inclination angle θ of the upper surface 51c of the bump 51a is provided with a range of 2° to 60° because this range was found to be appropriate according to experiments conducted concerning the positional relationship in the height direction between the first conductor (bonding pad) 10 and the second conductor (contact area) 20. That is, at the time of wire bonding the first conductor 10 and the second conductor 20, in the case where the first conductor 10 is disposed lower than the second conductor 20 on the circuit substrate 30, the wire 50 looped from the first conductor 10 can be easily guided to the upper surface 51c of the bump 51a having a small inclination angle θ on the second conductor 20. In contrast, in the case where the first conductor 10 is disposed higher than the second conductor 20, the wire 50 can be easily guided to the upper surface 51c having a large inclination angle θ.

The wire bonding operation mentioned above is executed by utilizing an ultrasonic application means.

Next, with reference to FIGS. 4 to 9, an embodiment of a bump and a forming method thereof according to the present invention will be explained.

Figure 4:
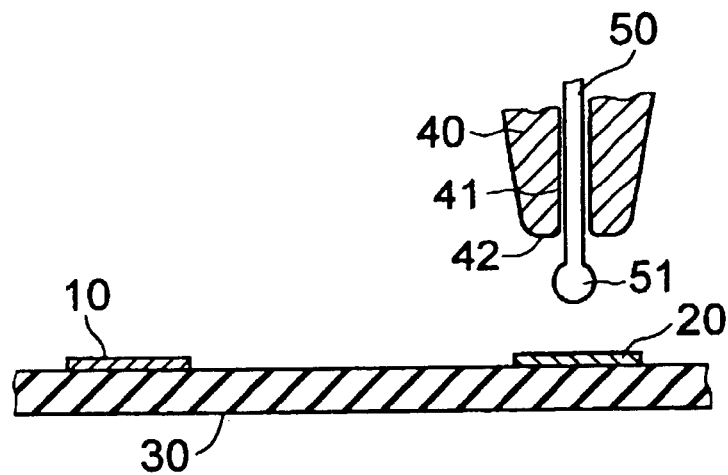
FIG. 4 is a diagram showing the state before executing a bump forming method according to the present invention, and showing a positional relationship between first and second conductors on a substrate and a capillary.

Referring to FIG. 4, a first conductor 10 and a second conductor 20 provided on a circuit substrate 30 made of a substrate such as a ceramic substrate, a printed substrate, a lead frame or the like, a capillary 40 constituting a part of a bonding device, and a wire 50 which is downwardly extended through a bore 41 formed in the capillary 40 and which is provided with a ball 51 formed at the tip end thereof are illustrated.

Now, an embodiment of a bump forming method according to the present invention will be explained with reference to FIGS. 5A to 5F.

First, the ball 51 is formed at the tip end of the wire 50 projecting from the bore 41 at a lower end portion 42 of the capillary 40 by heat of an electric flame off (not shown). To this stage, it is an ordinary step.

Figure 5A:
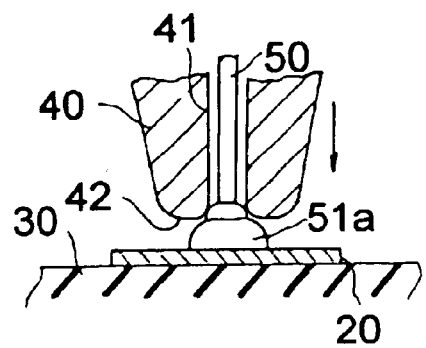
FIGS. 5A to 5E are diagrams showing the steps of an embodiment of a bump forming method according to the present invention and FIG. 5F is a diagram illustrating a path along which the capillary moves.

Then, in a first step shown in FIG. 5A, the capillary 40 is lowered to the second conductor 20 so that the ball 51 formed at the tip end of the wire 50 is bonded onto the second conductor 20, to thereby form a bump 51a on the second conductor 20.

Figure 5D:
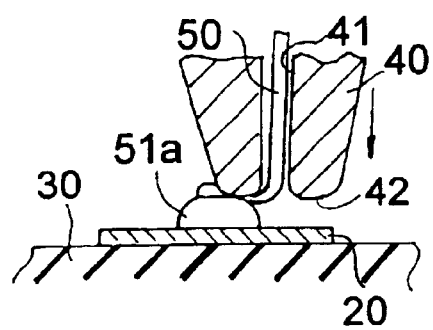
Figure 5B:
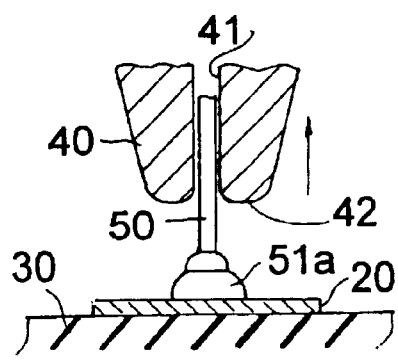

Then, in a second step shown in FIG. 5B, the capillary 40 is raised vertically.

Figure 5E:
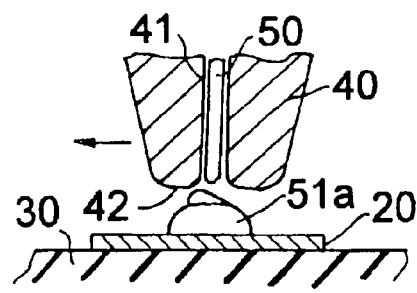
Figure 5C:
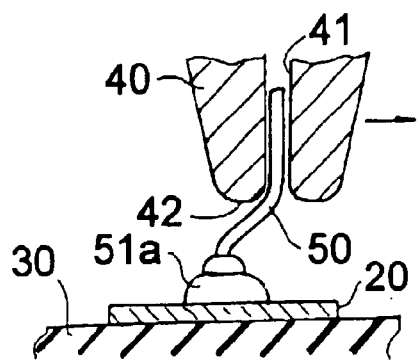

Next, in a third step shown in FIG. 5C, the capillary 40 is laterally moved to a side of the bump 51a away from the first conductor 10.

Thereafter, in a fourth step shown in FIG. 5D, the capillary 40 is lowered so as to press the lower end portion 42 of the capillary 40 onto a surface of the bump 51a.

Then, in a fifth step shown in FIG. 5E, the capillary 40 is laterally moved in a direction toward the first conductor 10.

Figure 5F:
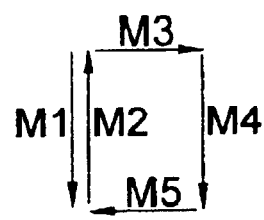

As shown in FIG. 5F, movement of the capillary in these steps can be represented by a path M1-M2-M3-M4-M5. Through these steps, the bump 51a with the upper surface 51c provided as an inclined surface can be formed on the surface of the second conductor 20.

Figure 6:
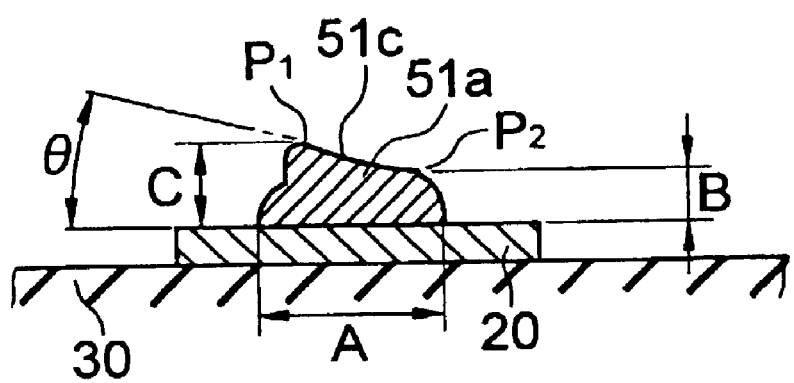
FIG. 6 is a cross-sectional view showing a bump formed by the embodiment shown in FIGS. 5A to 5F.

In the above-mentioned steps, moving distance and moving directions of the capillary 40 are controlled such that the bump 51a formed thereby has an inclination angle θ of a straight line connecting the opposite edges $P_1$ and $P_2$ of the upper surface 51c of the bump 51a to a face of the second conductor 20 provided with a range of 2° to 60°, which angle is open toward the first conductor 10 as viewed in cross-section in a vertical plane passing the first conductor 10 and the second conductor 20 as shown in FIG. 6.

In FIG. 6, reference characters A, B and C denote a diameter of a base portion of the bump 51a, a thickness of the base portion thereof and a height of the bump 51a, respectively.

Practically, the above-mentioned dimensions A, B and C are related also to a diameter of the wire 50. In the case where the diameter of the wire 50 is 7 to 100 μm, the diameter A of the base portion is set in a range of 25 to 300 μm, the thickness B of the base portion in a range of 4 to 60 μm, and the height C of the bump in a range of 10 to 200 μm. For example, in the case of a gold wire having a diameter of 30 μm, a bump 51a is formed to have a base portion of 75 μm in diameter A and 17 μm in thickness B and have a height C of 60 μm. Moreover, in another case of a gold wire having a diameter of 50 μm, a bump 51a is formed to have a base portion of 190 μm in diameter A and 35 μm in thickness B and have a height C of 110 μm.

Next, another embodiment of a bump forming method according to the present invention will be explained with reference to FIGS. 7A to 7H.

First, a ball 51 is formed at the tip end of a wire 50 projecting from a bore 41 at a lower end portion 42 of a capillary 40 by heat of an electric flame off (not shown).

Figure 7A:
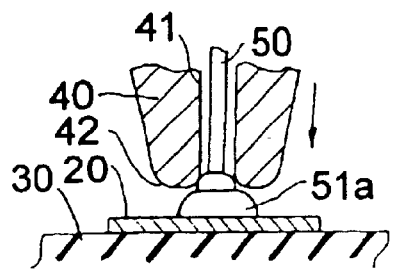
FIGS. 7A to 7G are diagrams showing the steps of another embodiment of a bump forming method according to the present invention and FIG. 7H is a diagram illustrating a path along which the capillary moves.

Next, in a first step shown in FIG. 7A, the capillary 40 is lowered to a second conductor 20 so that the ball 51 formed at the tip end of the wire 50 is bonded onto the second conductor 20, to thereby form a bump 51a.

Figure 7B:
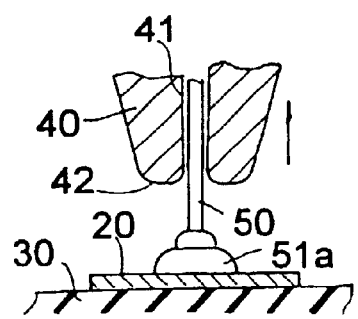

Then, in a second step shown in FIG. 7B, the capillary 40 is raised vertically.

Figure 7C:
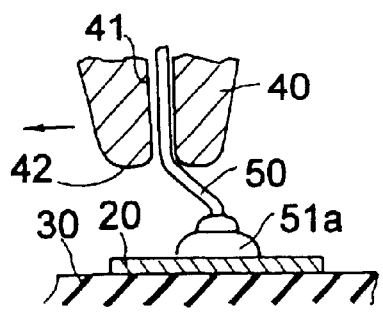

Thereafter, in a third step shown in FIG. 7C, the capillary 40 is laterally moved in a direction toward a first conductor 10.

Figure 7D:
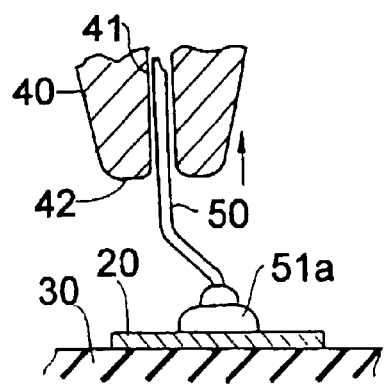

Then, in a fourth step shown in FIG. 7D, the capillary 40 is raised vertically.

Figure 7E:
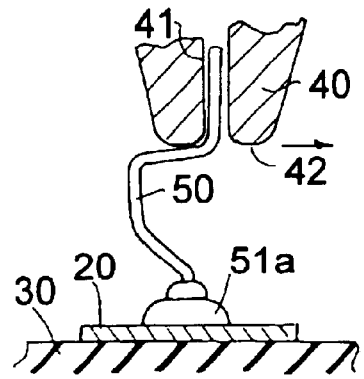

Next, in a fifth step shown in FIG. 7E, the capillary 40 is laterally moved to a side of the bump 51a away from the first conductor 10.

Figure 7F:
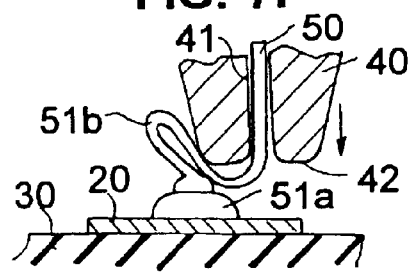

Subsequently, in a sixth step shown in FIG. 7F, the capillary 40 is lowered so as to press the lower end portion 42 of the capillary 40 onto a surface of the bump 51a.

Figure 7G:
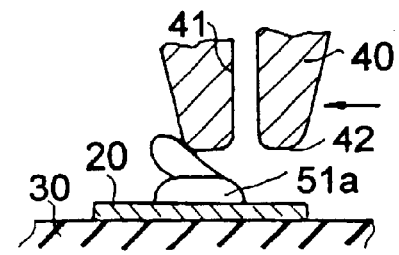

Finally, in a seventh step shown in FIG. 7G, the capillary 40 is laterally moved in the direction toward the first conductor 10.

Figure 7H:
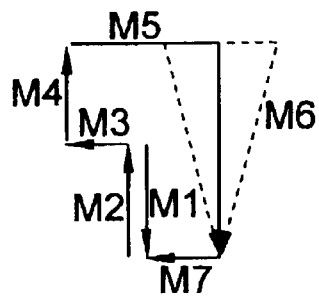

As shown in FIG. 7H, movement of the capillary in these steps can be represented by a path M1-M2-M3-M4-M5-M6-M7. Through these steps, the bump 51a with the upper surface 51c provided as an inclined surface can be formed on the surface of the second conductor 20.

Figure 8A:
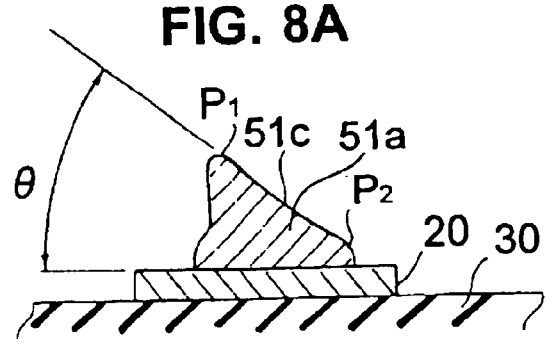
FIGS. 8A and 8B are cross-sectional views of the bumps formed by the embodiment shown in FIGS. 7A to 7H.
Figure 8B:
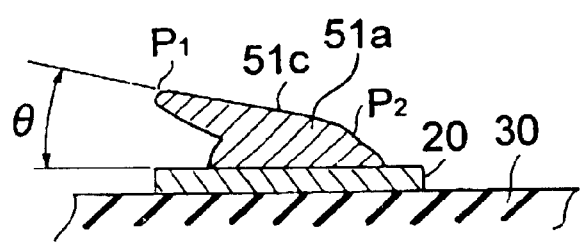

In the above-mentioned steps, moving distance and moving directions of the capillary 40 are controlled such that the bump 51a formed thereby has an inclination angle θ of a straight line connecting the opposite edges P₁ and P₂ of the upper surface 51c of the bump 51a to a face of the second conductor 20 provided with a range of 2° to 60°, which angle is open toward the first conductor 10 as viewed in cross-section in a vertical plane passing the first conductor 10 and the second conductor 20 as shown in FIGS. 8A and 8B.

In the above-mentioned steps, when the capillary 40 is moved as shown by the broken line in FIG. 7H, the amount of a bent portion 51b of the wire 50 placed on the upper surface 51c of the bump 51a is changed, so that the height of the bump 51a to be formed finally can be made larger as shown in FIG. 8A or an area of the upper end portion of the bump 51a can be made larger than that of the base portion thereof as shown in FIG. 8B.

As shown in FIGS. 3, 6, 8A and 8B, each of the bumps 51a according to the embodiments of the present invention has the upper surface 51c formed to be flat or concave and the inclination angle θ of the straight line connecting the opposite edges P₁ and P₂ of the upper surface 51c of the bump 51a to the face of the second conductor 20 provided with a range of 2° to 60°, which angle is open toward the first conductor 10 as viewed in cross-section in a vertical plane passing the first conductor 10 and the second conductor 20.

Figure 9:
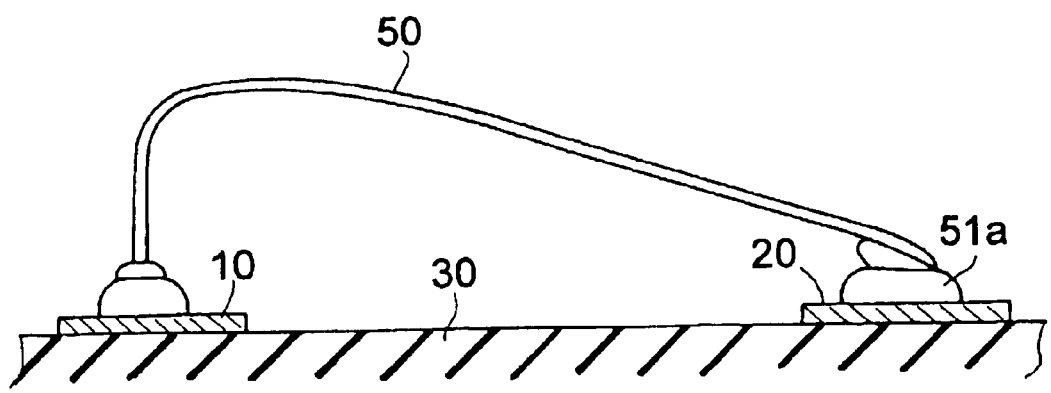
FIG. 9 is a cross-sectional view showing wire bonding, using a bump formed by an embodiment of a bump forming method according to the present invention.
Figure 10:
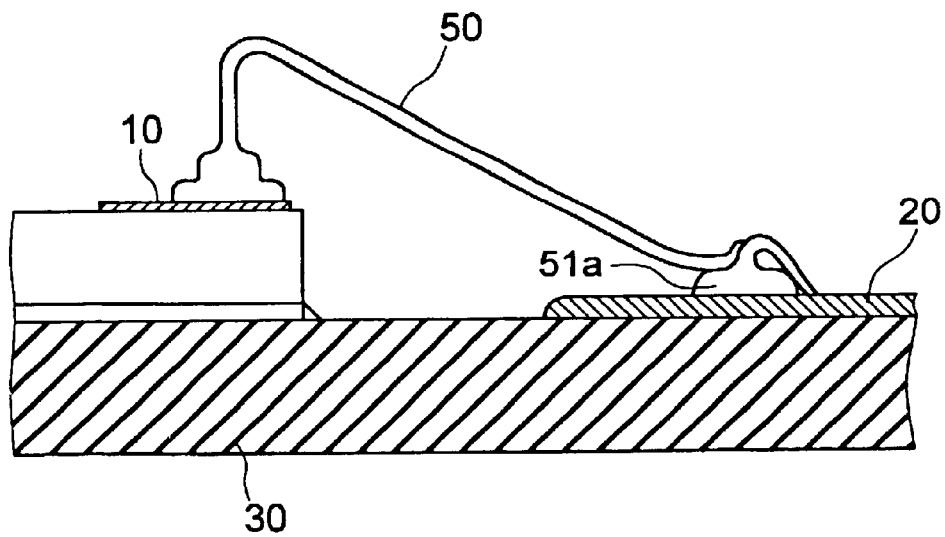
FIG. 10 is a diagram showing wire bonding, using a bump formed by a conventional bump forming method.
Figure 11:
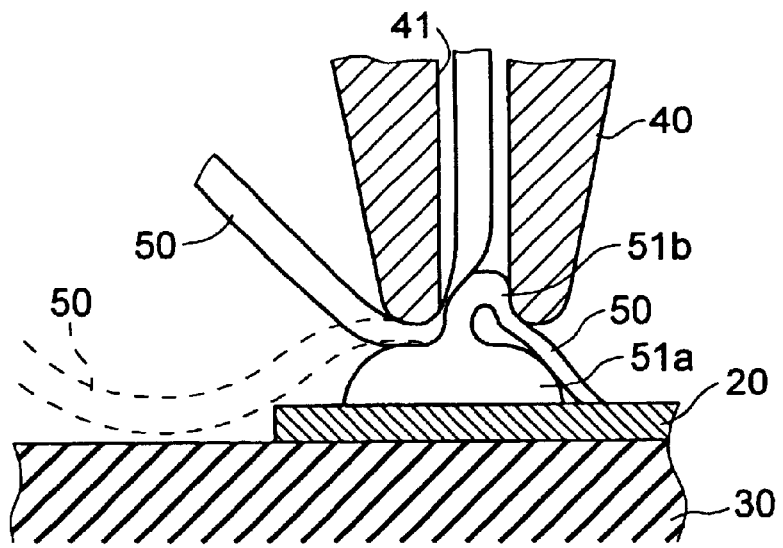
FIG. 11 is a diagram for explaining the problems of wire bonding using a bump formed by the conventional bump forming method.

When the bump 51a having the above-mentioned shape is previously formed on the surface of the second conductor 20, as shown in FIG. 9, at the time of looping the wire 50 from the first conductor 10 to the second conductor 20 and bonding the wire 50 thereto, the inclined surface serves as a guiding surface, to thereby reduce bending of the wire 50, so that contact between the wires with each other or contact of the wire 50 with the surface of the substrate due to sagging of the wire 50 or the like can be prevented.

As heretofore described, according to a wire bonding method of the present invention, the inclined surface formed in the upper end of the bump can provide the guiding surface at the time of wire looping and connection of the first conductor and the second conductor so that contact of the wire with the semiconductor chip or the pad can be prevented. Moreover, since the upper surface of the bump is formed to be an inclined surface, bending in the wire generated in the conventional method when wires are bonded together, can be eliminated, resulting in contact between the adjacent wires after wire bonding being eliminated. Furthermore, since wedge bonding with respect to the upper portion of the bump forms the inclined surface thereon, a residual wire or bump tail after wedge bonding can be eliminated so that a semiconductor package can be reduced in thickness. Moreover, in the case where the inclined surface is formed to be a flat surface or a concave surface, a bonding area can be enlarged so that bonding strength can be enhanced.

Moreover, according to a bump forming method of the present invention, a bump provided at the upper end thereof with an inclined surface, in which an inclination angle of the straight line connecting the opposite edges of the inclined surface of the bump to the face of the second conductor is 2° to 60°, which angle is open toward the first conductor as viewed in cross-section in a vertical plane passing the first conductor and the second conductor, can be formed, so that at the time of looping the wire from the first conductor to the second conductor and bonding the wire thereto, the inclined surface serves as the guiding surface, to thereby reduce bending in the wire, resulting in that contact of the wires with each other or contact of the wire with the substrate surface due to sagging of the wires or the like can be reduced as well as generation of bending of the wire can be prevented at the time of bonding the wire to the bump. Moreover, the inclination angle can be set as desired. A small inclination angle permits a residual wire on the bump to be reduced and thus a package can be made thin. Moreover, in the case where the first conductor is disposed at a high position, the inclination angle is formed to be large, whereby the wire connection can be executed easily and completely.

Furthermore, the area of the upper surface of the bump can be made larger, and thus the bonding area for the wire can be increased, so that the bonding strength can be enhanced.

What is claimed is:

1. A method of wire bonding a first conductor and a second conductor, comprising the steps of:

forming a bump on said second conductor by ball bonding on said second conductor;

forming an inclined surface on an upper end of said bump;

first bonding one end of a wire to said first conductor; and looping said wire from said first conductor to said bump on said second conductor, and then second bonding the other end of said wire to said inclined surface of said bump.

2. The method of wire bonding as defined in claim 1, wherein said inclined surface of said bump is so formed that a line connecting opposite edges of said inclined surface has an inclination angle of 2° to 60° to a face of said second conductor, which angle is open toward said first conductor.

3. A method of wire bonding a first conductor and a second conductor using a capillary having a bore formed therein and a wire extending through said bore, comprising the steps of:

forming a bump on said second conductor by ball bonding on said second conductor while positioning said capillary above said second conductor;

forming an inclined surface on an upper end of said bump by moving said capillary upwards, laterally moving said capillary to a side of said bump away from said first conductor, and moving said capillary downwards, followed by cutting said wire;

first bonding one end of said wire to said first conductor; and second bonding said wire extending from said bore of said capillary and said inclination surface of said bump by means of a lower end portion of said capillary while positioning said capillary at said inclination surface of said bump, and cutting said wire at a portion thereof near the bonded portion.

4. The method of wire bonding as defined in claim 3, wherein said inclined surface of said upper end of said bump is formed to be flat or concave; and said second bonding step includes pressing said wire onto said inclined surface of said bump by means of said lower end portion of said capillary while positioning said capillary at said inclination surface of said bump.

5. The method of wire bonding as defined in claim 3, wherein said inclined surface of said bump is so formed that a line connecting opposite edges of said inclined surface has an inclination angle of 2° to 60° to a face of said second conductor, which angle is open toward said first conductor.

6. The method of wire bonding as defined in claim 4, wherein said inclined surface of said bump is so formed that a line connecting opposite edges of said inclined surface has an inclination angle of 2° to 60° to a face of said second conductor, which angle is open toward said first conductor.

7. A method of forming a bump on a second conductor in advance by ball bonding when a first conductor and said second conductor are wire bonded by carrying out first bonding on said first conductor and carrying out second bonding on said second conductor, comprising the steps of:

lowering a capillary onto said second conductor and ball bonding a ball formed at a distal end of a wire to said second conductor, to thereby form a bump on said second conductor;

then vertically raising said capillary;

thereafter laterally moving said capillary in a direction away from said first conductor;

subsequently lowering said capillary onto said bump to press a lower end portion of said capillary against said bump; and thereafter laterally moving said capillary in a direction toward said first conductor, whereby said bump is provided on an upper end thereof with an inclined surface.

8. The method of forming a bump as defined in claim 7, wherein said inclined surface of said bump is so formed that a line connecting opposite edges of said inclined surface has an inclination angle of 2 to 60° to a face of said second conductor, which angle is open toward said first conductor.

9. A method of forming a bump on a second conductor in advance by ball bonding when a first conductor and said second conductor are wire bonded by carrying out first bonding on said first conductor and carrying out second bonding on said second conductor, comprising the steps of:

lowering a capillary onto said second conductor and ball bonding a ball formed at a distal end of a wire to said second conductor, to thereby form a bump on said second conductor;

then vertically raising said capillary;

thereafter laterally moving said capillary in a direction toward said first conductor;

then vertically raising said capillary;

thereafter laterally moving said capillary in a direction away from said first conductor;

subsequently lowering said capillary onto said bump to press a lower portion of said capillary against said bump; and thereafter laterally moving said capillary in a direction toward said first conductor, whereby said bump is provided on an upper end thereof with an inclined surface.

10. The method of forming a bump as defined in claim 9, wherein said inclined surface of said bump is so formed that a line connecting opposite edges of said inclined surface has an inclination angle of 2° to 60° to a face of said second conductor, which angle is open toward said first conductor.

11. A bump which is formed on a second conductor in advance by ball bonding when a first conductor and said second conductor are wire bonded by carrying out first bonding on said first conductor and carrying out second bonding on said second conductor, comprising:

an upper surface, which is formed to be flat or concave and which is so formed that a line connecting opposite edges of said upper surface has an inclination angle of 2° to 60° to a face of said second conductor, which angle is open toward said first conductor.

\* \* \* \* \*

UNITED STATES PATENT AND TRADEMARK OFFICE
CERTIFICATE OF CORRECTION

PATENT NO. : 6,715,666 B2  Page 1 of 1
DATED : April 6, 2004
INVENTOR(S) : Rei Imai et al.

It is certified that error appears in the above-identified patent and that said Letters Patent is hereby corrected as shown below:

Column 8,
Line 2, after "bump." insert a new paragraph.

Column 9,
Line 24, "2" should read -- 2' --.

Signed and Sealed this

Thirtieth Day of November, 2004

JON W. DUDAS
*Director of the United States Patent and Trademark Office*

UNITED STATES PATENT AND TRADEMARK OFFICE
CERTIFICATE OF CORRECTION

PATENT NO. : 6,715,666 B2 Page 1 of 1
APPLICATION NO. : 10/243201
DATED : April 6, 2004
INVENTOR(S) : Rei Imai et al.

It is certified that error appears in the above-identified patent and that said Letters Patent is hereby corrected as shown below:

Column 8,
Line 2, after "bump." insert a new paragraph.

Column 9,
Line 24, "2" should read -- 2° --.

This certificate supersedes Certificate of Correction issued November 30, 2004.

Signed and Sealed this

Twenty-seventh Day of November, 2007

JON W. DUDAS
*Director of the United States Patent and Trademark Office*